(12) United States Patent
Lesso

(10) Patent No.: US 10,700,648 B2
(45) Date of Patent: Jun. 30, 2020

(54) AUDIO AMPLIFIERS

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/993,990

(22) Filed: May 31, 2018

(65) Prior Publication Data

US 2018/0351516 A1    Dec. 6, 2018

Related U.S. Application Data

(60) Provisional application No. 62/514,365, filed on Jun. 2, 2017.

(30) Foreign Application Priority Data

Jul. 11, 2017    (GB) .................................. 1711163.4

(51) Int. Cl.
*H03F 3/68* (2006.01)
*H03F 1/34* (2006.01)
(Continued)

(52) U.S. Cl.
CPC ............. *H03F 1/34* (2013.01); *H03F 1/0205* (2013.01); *H03F 1/26* (2013.01); *H03F 1/32* (2013.01);
(Continued)

(58) Field of Classification Search
CPC ...... H03F 3/45475; H03F 1/32; H03F 1/3229; H03F 2200/78
(Continued)

(56) References Cited

U.S. PATENT DOCUMENTS 5,696,831 A * 12/1997 Inanaga ................. H04S 1/007
                                                          381/309
5,815,585 A    9/1998 Klippel
(Continued)

FOREIGN PATENT DOCUMENTS

GB    2529691 A    3/2016
WO    03015263 A1    2/2003

OTHER PUBLICATIONS

International Search Report and Written Opinion of the International Searching Authority, International Application No. PCT/GB2018/051397, dated Aug. 10, 2018.
(Continued)

Primary Examiner — George C Monikang
(74) Attorney, Agent, or Firm — Jackson Walker L.L.P.

(57) ABSTRACT

This application relates to audio driving circuits having good audio performance. The circuit (301) has a forward signal path between an input (103) for receiving an input audio signal ($S_{IN}$) and an output (104) for outputting an output signal ($S_{OUT}$) with an amplifier module (102) in the forward signal path. An error block (302) is arranged to receive a first signal ($S_{FF}$) derived from the input signal and also a second signal ($S_{FB}$) derived from the output signal and determine a first error signal ($\varepsilon_1$) indicative of a difference between the first and second signals. A first processing module (204) is operable to generate a compensation signal ($S_C$) to be applied to the input signal ($S_{IN}$) upstream of the amplifier module (102) based on the first error signal. The error block (302) comprises a second processing module (303/303a) configured to apply a linear transfer function to one of the first signal or the second signals prior to determining the first error signal. In some embodiments the second processing module may apply a linear transfer function which is adaptive based on a second error signal ($\varepsilon_2$) indicative of the error
(Continued)

between the first and second signals after the linear transfer function has been applied.

18 Claims, 3 Drawing Sheets

(51) Int. Cl.
  *H03F 3/187* (2006.01)
  *H03F 1/32* (2006.01)
  *H03F 3/181* (2006.01)
  *H03F 1/02* (2006.01)
  *H03F 1/26* (2006.01)
  *H03F 3/217* (2006.01)
  *H03G 3/30* (2006.01)
  *H04R 3/00* (2006.01)

(52) U.S. Cl.
  CPC ......... *H03F 1/3247* (2013.01); *H03F 1/3264* (2013.01); *H03F 3/181* (2013.01); *H03F 3/187* (2013.01); *H03F 3/217* (2013.01); *H03G 3/3005* (2013.01); *H03F 2200/03* (2013.01); *H03F 2200/102* (2013.01); *H03F 2200/129* (2013.01); *H03F 2200/171* (2013.01); *H03F 2200/264* (2013.01); *H03F 2200/267* (2013.01); *H04R 3/00* (2013.01)

(58) Field of Classification Search
  USPC .................................................. 381/28, 120
  See application file for complete search history.

(56) References Cited

U.S. PATENT DOCUMENTS

| | | | |
|---|---|---|---|
| 7,362,821 B1 | 4/2008 | Shirali | |
| 9,607,628 B2 | 3/2017 | Gautama | |
| 2009/0027117 A1* | 1/2009 | Andersen | H03F 1/26 330/10 |
| 2009/0083047 A1* | 3/2009 | Lindahl | G10L 21/04 704/504 |
| 2010/0074452 A1* | 3/2010 | Adeney | H04M 9/082 381/66 |
| 2013/0077806 A1* | 3/2013 | Zhang | H03F 3/2173 381/120 |
| 2013/0222059 A1 | 8/2013 | Kilambi et al. | |
| 2016/0065158 A1* | 3/2016 | Lesso | H03G 7/002 330/251 |
| 2016/0232886 A1 | 8/2016 | Vaidhyanathan et al. | |

OTHER PUBLICATIONS

Park, Jong-hu et al., A Novel Controller for Switching Audio Power Amplifier with Digital Input, 33rd Ann. IEEE Power Electronics Specialists Conference, vol. 1, pp. 39-44, Jun. 23-27, 2002, Australia.

Combined Search and Examination Report, UKIPO, Application No. GB1711163.4, dated Jan. 12, 2018.

* cited by examiner

AUDIO AMPLIFIERS

TECHNICAL FIELD

This application relates to methods and apparatus for amplification of audio signals, and in particular to amplifiers that may be used to drive different types of load such as headphone amplifiers.

BACKGROUND INFORMATION

Various electronic devices have audio driver, i.e. amplifier, circuitry for driving an audio signal to an audio load, e.g. a loudspeaker, and often devices may have a connector, in the form of a plug and socket for example, for outputting audio signals to an external device. The external device could be a peripheral device such as a headset with relatively small loudspeakers, e.g. located in earphones or earbuds or the like. Such headset loudspeakers will typically have a relatively low impedance, say of the order of a few ohms or so.

For high quality sound reproduction the distortion of the audio signal, especially THD (total harmonic distortion) and intermodulation distortion, should be low. Various factors may contribute to distortion in an amplifier circuit driving a load. Typically the distortion is worst for lower impedance loads. An amplifier may be designed to maintain adequately low distortion into a low impedance load by increasing the output stage quiescent current, generally requiring larger output driving devices and higher current pre-driver stages. Distortion may also be managed by designing the amplifier circuitry with multiple amplifier stages to attempt to suppress output distortion by a high open-loop amplifier gain. However these approaches generally increase both the power consumption of the amplifier circuitry and the size and complexity, and hence cost, of the circuitry.

For many electronic devices, e.g. especially for battery powered devices where power demands impact on battery life, power efficiency of the components of the device may be a concern. Higher power consumption may also have associated cooling requirements. The size and cost of components are also of concern for such applications.

SUMMARY OF EMBODIMENTS

Embodiments of the present disclosure relate to methods and apparatus for audio amplification that mitigate at least of the above mentioned issues.

Thus according to the present invention there is provided an audio driving circuit comprising:
  a forward signal path between an input for receiving an input audio signal and an output for outputting an output signal;
  an amplifier module in the forward signal path;
  an error block for receiving a first signal derived from the input signal and a second signal derived from the output signal and operable to determine a first error signal indicative of a difference between the first and second signals;
  a first processing module operable generate a compensation signal to be applied to the input signal upstream of the amplifier module, wherein the compensation signal is based on the first error signal;
  wherein the error block comprises a second processing module configured to apply a linear transfer function to one of the first signal or the second signals prior to determining the first error signal.

In some embodiments the second processing module may comprise a finite impulse response filter or an infinite impulse response filter.

In some embodiments the second transfer function may be adaptive based on a second error signal, wherein the second error signal is indicative of a difference between the first and second signals after the second transfer function has been applied. The second processing module may be configured to apply a least-mean-squares adaptation or a recursive least-mean-squares adaptation to the second transfer function based on the second error signal. In some embodiments the amplifier module may be operable to provide a variable gain in the forward signal path.

The second processing module may configured to apply the second transfer function to the first signal or to the second signal.

In some implementations the first processing module may be configured to control the extent to which the first error signal contributes to the compensation signal applied to the input audio signal, based on an indication of the level of the input audio signal. The first processing module may comprise a gain controller for applying a controlled gain to a first compensation signal derived from the first error signal in order to generate the compensation signal which is applied to the input audio signal. The controlled gain may be controlled based on the indication of the level of the input audio signal. The gain controller may be operable such that the controlled gain is a first gain for a first input audio signal level and is a second lower gain for a second lower input audio signal level. The first gain may, in some implementations, be unity gain. The second gain may, in some implementations, be a gain factor of zero. The first processing module may comprise an integrator configured to receive the first error signal and output the first compensation signal. In some instances an envelope detector may be configured to receive a version of the input audio signal and determine an envelope value as the indication of the level of the input audio signal.

The audio circuit may be operable in an open-loop mode wherein the compensation signal has zero magnitude or is not applied to the input signal in the forward signal path.

In some embodiments a gain element may be configured to apply a gain to one of the first or second signals to compensate for a known gain in the forward signal path.

The circuit may further comprise an analogue-to-digital conversion module for receiving an analogue feedback signal derived from the audio driving signal and outputting a corresponding digital signal as said second signal. In some embodiments, where the audio driving circuit is implemented as an integrated circuit, the analogue-to-digital conversion module may be configured to receive the analogue feedback signal externally from the integrated circuit.

Embodiments also relate to an audio apparatus comprising an audio driving circuit as described. In such an apparatus he output of the audio driving circuit may be coupled to an output audio path that comprises at least one non-linear component. In some implementations the second signal indicative of the voltage of the output signal may be derived from the output audio path downstream of the at least one non-linear component. Additionally or alternatively there may be a first connector for removably connecting to a mating second connector of a peripheral device and the apparatus may be operable, in use, to supply the output signal to the first connector for driving an audio transducer of a connected peripheral device. The audio apparatus may comprise at least one of: a battery powered device; a portable device; a communications device; a mobile telephone; a smartphone; a computing device; a laptop; notebook or tablet computer; a gaming device; a personal media player; a wearable device; a voice controlled device.

In another aspect there is provided an audio driving circuit for receiving an input audio signal and an output for outputting an output signal, the audio driving circuit comprising:

an amplifier;
an error block for determining a first error signal indicative of any error between the input audio signal and a feedback signal derived from the output signal; and
a compensation module for combining the input audio signal with a compensation signal based on the first error signal;
wherein the error block comprises a processing module for applying a linear transfer function to the input audio signal or the feedback signal before determining the first error signal.

The linear transfer function may be an adaptive function.

In a further aspect there is provided an audio driving circuit comprising:

a forward signal path between an input for receiving an input audio signal and an output for outputting an output signal;
an error block for receiving a first signal derived from the input signal and a second signal derived from the output signal and operable to determine a first error signal indicative of a difference between the first and second signals; and
a compensation module for combining the input audio signal with a compensation signal based on the first error signal;
wherein the error block is configured to gain to at least one the first signal and the second signal so as to compensate for a gain applied in the forward signal path before determining the first error signal.

BRIEF DESCRIPTION OF THE DRAWINGS

Embodiments will now be described by way of example only with reference to the accompanying drawings, of which.

DETAILED DESCRIPTION

Embodiments of the invention provide amplifier circuitry and methods of amplification that are operable to provide good distortion performance. Amplifier circuits according to embodiments of the disclosure may be relatively small in circuit area and/or have relatively low power requirements compared to conventional amplifiers of similar performance.

Figure 1:
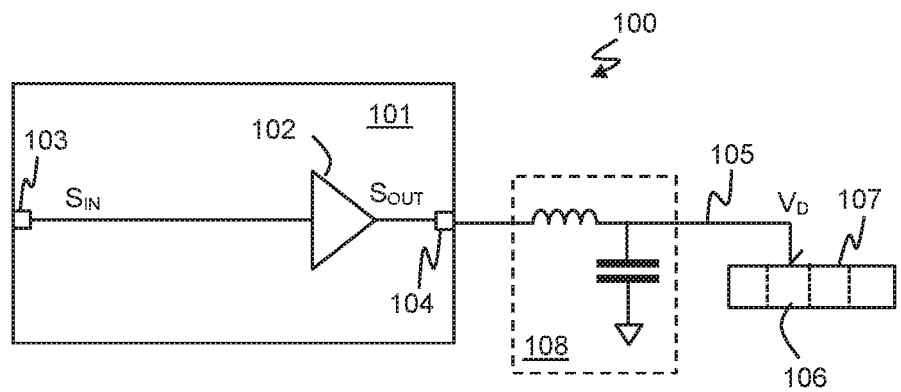
FIG. 1 illustrates a typical amplifier circuit arrangement.

FIG. 1 illustrates one example of a generalised audio amplifier arrangement 100 for driving an audio load, e.g. an audio transducer such as a loudspeaker, with an audio driving signal $V_D$. An audio driving circuit 101, such as an audio codec, comprises an amplifier module 102 for generating an output signal $S_{OUT}$ for driving the audio load based on an input signal $S_{IN}$, which may be an input digital signal, received at an input node 103. The input node 103 could be a suitable contact, e.g. a pin or pad, of the audio driving circuit 101 or may just be a node of a signal path, for instance coupled to the output of some upstream processing block. The amplifier module 102 will typically comprise at least one amplifier stage and, depending on the type of amplifier, may include a DAC (digital-to-analogue converter) to convert a received digital signal into an analogue signal for amplification, although in some instances the amplifier module 102 may comprise an amplifier, such as a class-D amplifier, that operates with digital inputs.

The output signal $S_{OUT}$ is output from the audio driving circuit 101 via a suitable output node 104, for example an output pin of the codec, and propagated via an audio signal path 105 to the relevant audio load to be applied as an audio driving signal $V_D$. Where the audio driving circuit 101 is formed as an integrated circuit, i.e. on a chip, the signal path 105 will be at least partly, if not wholly, external to the integrated circuit, i.e. off-chip, and may, for example, be at least partly formed on a circuit board of the host device, i.e. the device within which the audio driving circuit 101 is located. In some instances the amplifier module 102 may be used to drive an audio transducer, e.g. loudspeaker, of an apparatus which is external to the host device, for instance an accessory apparatus, such as a headset, that may be removably connected to the host device, in use, for transfer of audio signals. The signal path 105 may thus connect, in use, the output terminal 104 of the audio driving circuit 101 to a suitable contact 106 of a connector 107 of the host device. The connector 107 may be any suitable connector for making a connection with an external apparatus. The connector may for example be a jack socket for making a mating connection with a corresponding jack plug, such as a TRS or TRRS jack plug, or may be some other suitable receptacle such as a USB receptacle or socket. In such cases the amplifier module 102 may thus be connected, at times, to drive any of a variety of different audio loads, from small speakers of earbuds or the like, to larger headset speakers or speakers of some docking station or similar apparatus.

There will typically be at least some distortion introduced into the output signal $S_{OUT}$, and hence audio driving signal $V_D$, due to the amplifier module 102. Previously it may have been assumed that such an amplifier circuit, e.g. a headphone amplifier circuit, would mainly be used to drive some relatively low quality headphones and thus the requirements for the distortion performance of the amplifier may have been relatively low. Increasingly it is desired that such audio circuits be capable of driving such an array of different loads and with relatively low levels of distortion.

As mentioned above, amplifiers may be designed to maintain adequately low distortion through the use of relatively large output stage quiescent currents and/or using multiple amplifier stages with a high open-loop amplifier gain, but these approaches require relatively high power consumption and/or a relatively large circuit area for the amplifier and, especially for portable electronic devices, power and size are important considerations. Generally it is desired to keep power and size requirements as low as possible.

Also, in some instances the external or off-chip audio signal path 105, which may for instance be a path on a circuit board, may comprise various analogue components 108. In some instances the analogue components may exhibit non-linear behaviour. For instance it is common for EMI (electromagnetic interference) reduction to filter the signal path 105, which may typically use ferrite based filtering. A ferrite bead provides a series inductance for the signal path with a capacitor providing a defined impedance to ground. Such non-linear components can add to the distortion in the audio driving signal $V_D$ supplied to the audio load.

Figure 2:
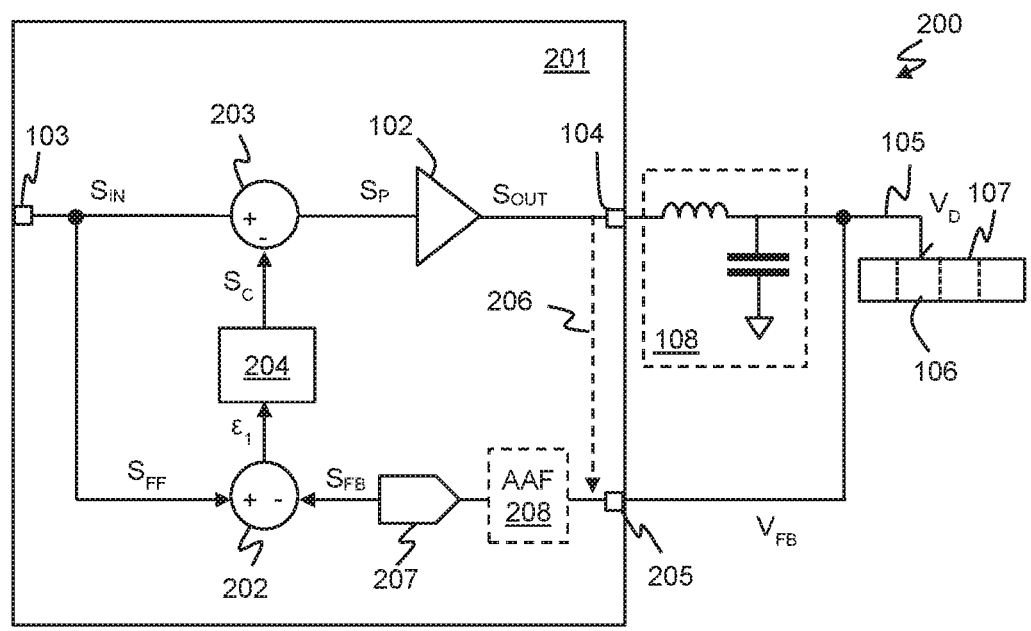
FIG. 2 illustrates an amplifier circuit arrangement with analogue feedback.

One way to improve audio performance may be to use feedback. FIG. 2 illustrates an example of an audio amplifier arrangement 200 in which similar components to those illustrated in FIG. 1 are identified with the same reference numerals.

FIG. 2 illustrates an audio driving circuit 201 that again has an amplifier module 102 in a forward signal path between the input node 103 and the output node 104. In the arrangement illustrated in FIG. 2 however, an error block 202 is arranged to receive a first signal $S_{FF}$ derived from the input signal $S_{IN}$ and also a second signal $S_{FB}$, which is a feedback signal derived from the output signal $S_{OUT}$. The error block 202 determines any error between the first and second signals $S_{FF}$ and $S_{FB}$, and generates a first error signal $\varepsilon_1$. This first error signal $\varepsilon_1$ is thus indicative of any errors between the feedback signal $S_{FB}$ (and hence the output signal $S_{OUT}$) and the input signal $S_{IN}$ and thus can indicate the extent of any distortion in the feedback signal $S_{FB}$. This first error signal $\varepsilon_1$ can be used as the basis for a correction signal $S_C$ to be applied to the input signal $S_{IN}$, e.g. by combiner 203, to reduce the extent of any such error. In some instances the first error signal $\varepsilon_1$ could be applied directly as the compensation signal $S_C$. However in some instances a first processing module 204 could be arranged to generate a suitable compensation signal $S_C$ from the first error signal $\varepsilon_1$, for example by integrating the first error signal $\varepsilon_1$.

The feedback signal $S_{FB}$ may be derived from the signal path 105 which is downstream of the output node 104. Thus a voltage feedback signal $V_{FB}$ may be tapped from an appropriate point of the signal path 105. In particular the voltage feedback signal $V_{FB}$ may be derived from the signal path 105 downstream of at least some analogue components 108 of the signal path 105, so that the feedback signal includes any effects of components on the audio driving signal $V_D$ applied to the load. This will allow the compensation applied to attempt to compensate for any error introduced by such components. Where the amplifier circuit 201 is an integrated circuit, such as a codec or the like, the voltage feedback signal $V_{FB}$ may be an external, i.e. off-chip, feedback signal that is received at some suitable connection 205, e.g. pin, of the audio circuit 201. This may however require a suitable circuit terminal or pin to be provided, which may increase pin count and increase chip area. In some embodiments therefore where no such circuit pin or terminal is available or desirable and/or the effect of any off-chip non-linearity is not deemed significant, the audio driving signal $V_{OUT}$ may be tapped on chip to provide the voltage feedback, as illustrated by dotted path 206.

In either case, the voltage feedback signal $V_{FB}$ will thus be an analogue signal. In general, for power and size reasons, it is advantageous for the audio circuit to comprise digital circuitry as far as possible. Therefore, in the example illustrated in FIG. 2 the feedback path includes an analogue-to-digital converter (ADC) 207 for receiving the voltage feedback signal $V_{FB}$ and outputting the feedback signal $S_{FB}$ for the error block 202 as a digital signal.

It will be understood that in such an analogue feedback arrangement the performance of the ADC 207 will be important. For example if the ADC 207 introduces noise into the digital feedback signal $S_{FB}$ then such noise may be introduced into the signal in the forward signal path. Likewise, in order to improve audio performance the first error signal $\varepsilon_1$ should be an accurate representation of the error between the input signal $S_{IN}$ and the voltage feedback signal $V_{FB}$.

An ADC 207 implemented as illustrated in FIG. 2 would thus generally need to have good noise performance, better than that of the forward signal path, in order to provide a benefit. Conventionally this would require an ADC that would be relatively large and/or with relatively high power requirements. The requirements for the ADC may be such that there is no size or power benefit compared to implementing a higher specification amplifier.

Any noise introduced by feedback ADC 207 may be more of a concern for an input signal $S_{IN}$ of lower amplitude. At low signal amplitudes any noise, e.g. quantisation noise, introduced by ADC 207 may have a relatively significant impact on signal-to-noise ratio (SNR) of the forward signal path. At low amplitudes however the effect of any distortion may be relatively limited. For an input signal $S_{IN}$ of higher amplitude, distortion may be more of a concern, but noise of the feedback ADC 207 may be less of a concern as the higher signal level will provide a better SNR. The first processing module 204 may therefore be arranged to vary the contribution of the first error signal $\varepsilon_1$ to the compensation signal $S_C$ based on an indication of the level, i.e. amplitude or signal envelope, of the input signal $S_{IN}$ being amplified. For instance the first processing module may vary a gain applied when generating the compensation signal $S_C$, based on an indication of the level of the input signal $S_{IN}$. In some instances there may be no compensation signal applied if the level of the input signal $S_{IN}$ is relatively low, e.g. below a defined threshold. In other words if the input signal $S_{IN}$ is a low level signal the gain applied to the compensation signal may be a factor of zero. In effect for low signal levels the feedback may be disabled and the audio circuit 201 operates in an open-loop mode. At higher signal levels a non-zero gain may be applied and a compensation based on the first error signal $\varepsilon_1$ is applied to the input signal $S_{IN}$, i.e. the audio circuit operates in a closed-loop mode.

Such an arrangement can thus relax the requirements on the feedback ADC 207 as the noise contribution from the ADC 207 is reduced or removed for low level signals whilst maintaining the performance benefits for higher level signals where distortion may be more of a concern.

The arrangement illustrated in FIG. 2 assumes that the gain of the forward signal path is unity. In some instances however there may be amplification gain associated with the amplifier module 102. The voltage feedback signal $V_{FB}$ will include the effects of any amplification gain, which could lead to an apparent error between the feedback signal $S_{FB}$ and the input signal $S_{IN}$ and lead to loop instability.

Embodiments of the present disclosure relate to audio driving circuits that are operable to use feedback so as to improve audio performance and that are operable with non-unity gain in the forward signal path. In at least some embodiments the gain of the forward signal path may be variable. In embodiments of the invention a first error signal is determined indicative of the error between the input signal and a feedback signal and the first error signal is used to generate a compensation signal.

Figure 3A:
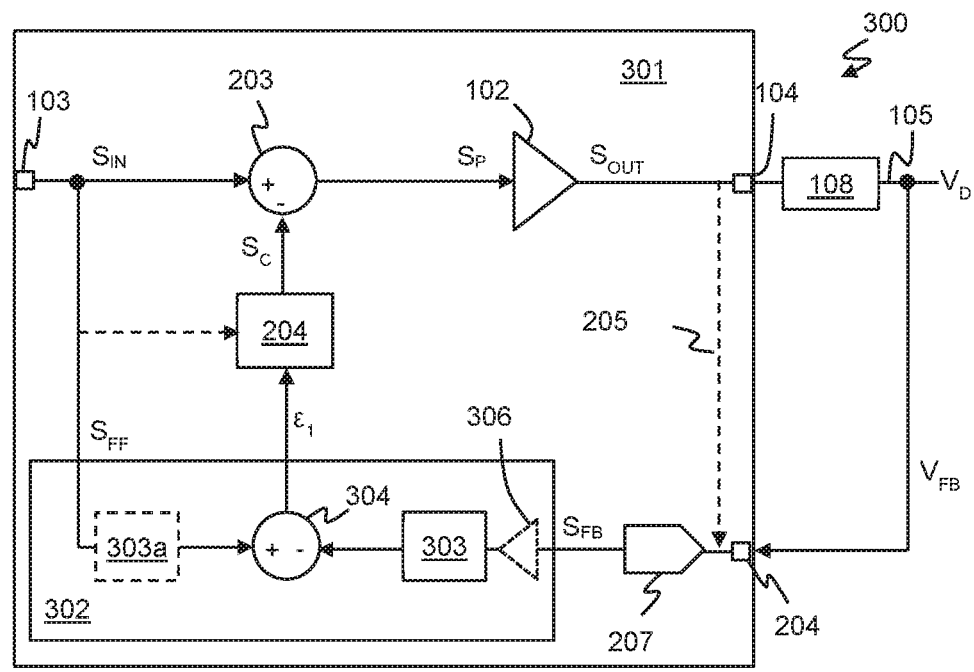
FIGS. 3a and 3b illustrate amplifier circuit arrangements with feedback according to embodiments.

FIG. 3a illustrates an amplifier circuit arrangement 300 having an audio driving circuit 301 according to an embodiment where again similar components are identified by similar reference numerals. Audio driving circuit, which may be an integrated circuit such as a codec or the like, has a forward audio signal path extending between input 103 for receiving an input audio signal $S_{IN}$ and an output 104 for outputting an output signal $S_{OUT}$. As described above the input 103 may be a terminal, e.g. pad or pin, of an integrated circuit but may be a node of the circuit 301, e.g. an output of an upstream processing block or just a node of the signal path. Likewise the output 104 may be an output terminal or a suitable node of the downstream signal path. An amplifier module 102 is located in the forward signal path. The amplifier module 102 may comprise at least one analogue amplifier stage, for instance a class AB type amplifier or similar, in which case the amplifier may comprise a digital-to-analogue converter (DAC). In other embodiments the amplifier module 102 may comprise a class-D type or similar which may operate with a digital input.

An error block 302 is arranged to receive a first signal $S_{FF}$ derived from the input signal $S_{IN}$ and also a second signal $S_{FB}$ indicative of the voltage of the output signal $S_{OUT}$. The second signal may be derived from the output signal $S_{OUT}$ directly, e.g. via an on-chip feedback path 205, however in some embodiments the second signal may be derived from the output signal $S_{OUT}$ that has been propagated at least part of the way along the downstream signal path 105 and may be representative of the audio driving signal $V_D$.

In a similar fashion as discussed with respect to FIG. 2 the error block 302 is operable to determine a first error signal $\varepsilon_1$ indicative of a difference between the first and second signals $S_{FF}$ and $S_{FB}$. A first processing module 204 may be operable to generate a compensation signal $S_C$ based on the first error signal $\varepsilon_1$, with the compensation signal $S_C$ being applied to the input signal $S_{IN}$ in the forward signal path upstream of the amplifier module 102, for instance by being combined with the input signal $S_{IN}$ by a combiner 203 in a similar fashion as described above.

In embodiments of the disclosure the error block 302 comprises a second processing module 303 configured to apply a linear transfer function to one of the first signal $S_{FF}$ or the second signal $S_{FB}$, prior to determining the first error signal $\varepsilon_1$. In the example illustrated in FIG. 3 the second processing module 303 is arranged to apply the linear transfer function to the second signal $S_{FB}$, i.e. the feedback signal indicative of the output signal $S_{OUT}$. In other embodiments however the second processing module could be arranged to apply the linear transfer function to the first signal $S_{FF}$ indicative of the input signal $S_{IN}$ as illustrated by module 303a.

The linear transfer function applied by the second processing module 303 at least partly compensates for a linear transfer function associated with the forward signal path, e.g. any gain experienced in the forward signal path.

In this way the first signal $S_{FF}$ and second signal $S_{FB}$ are effectively compensated to remove or reduce the linear gain effects of the forward signal path so that first error signal is indicative of any other error, e.g. unwanted distortion. The linear transfer function applied by the second processing module may therefore be based on a known or expected linear transfer function for the forward signal path.

In some implementations however the amplification gain in the main signal path may be variable. For instance the amplifier module 102 may comprise a class AB type amplifier with a deliberately variable amplification gain, for instance a programmable gain amplifier. In another example the amplifier module may comprise a class-D amplifier where the supply voltage for the class-D amplifier may be variable and hence the gain of the amplifier is variable.

If, in use, the amplification gain were to change the loop stability would be impacted and unwanted errors would be introduced. Thus in some embodiments of the disclosure a linear transfer function is applied by the error block, to at least partly compensate for linear effects of the forward signal path, is adaptive.

Figure 3B:
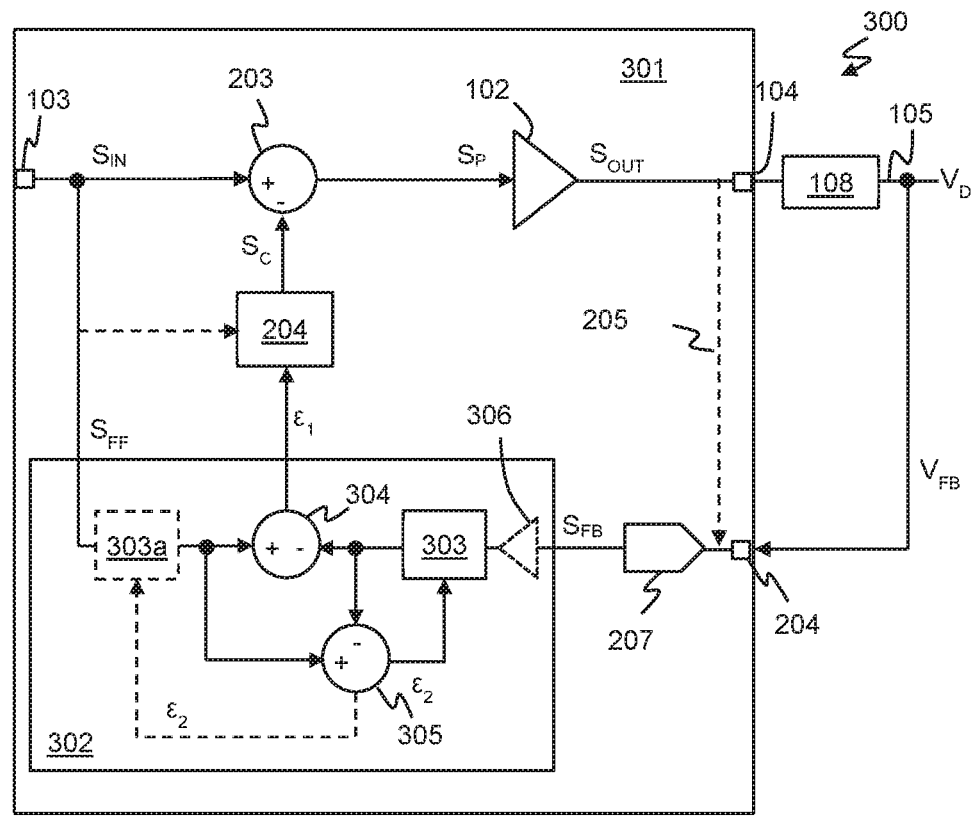

FIG. 3b illustrates an embodiment of the disclosure where the linear transfer function applied by the second processing module is adaptive based on a second error signal $\varepsilon_2$. The second error signal $\varepsilon_2$ is indicative of a difference between the first and second signals $S_{FF}$ and $S_{FB}$ after the linear transfer function has been applied by the second processing module 303.

The second processing module 303 adapts the linear transfer function applied so as to reduce the extent of any such error, e.g. to minimise the error. The linear transfer function applied will thus be adapted to compensate for any error introduced between the input signal $S_{IN}$ and the feedback signal $S_{FB}$ due to linear effects in the forward signal path, which will include any amplification gain applied in the forward signal path.

FIG. 3b illustrates that second processing module 303 applies the linear transfer function to the received second signal $S_{FB}$, i.e. the digital feedback signal indicative of the voltage of the output signal $S_{OUT}$. In such a case the linear function can be seen as attempting to reverse the effects of the linear transfer function associated with the forward signal path. Thus if the linear transfer function associated with the forward signal path were H for example than the linear transfer function applied by second processing module 303 could be seen as an estimate of the inverse function H.

Alternatively, as mentioned, the second processing module could, as illustrated by module 303a, be configured to apply the linear transfer function to the first signal $S_{FF}$ received by the error block 302, in which case the linear transfer function could be an estimate of the function H for the forward signal path. Alternatively in some embodiments it could be possible to have two processing modules 303a and 303 arranged to apply complementary linear transfer functions to the first and second signals $S_{FF}$ and $S_{FB}$ respectively to collectively compensate for the linear transfer function H of the forward signal path. In such a case one of the processing modules may be adaptive, and the second error signal $\varepsilon_2$ may be determined as the error between the outputs of the two processing modules 303 and 303a.

In at least some embodiments however it may be preferable to arrange the second processing module to apply the linear transfer function to the second signal $S_{FB}$, as illustrated by processing module 303, without any significant processing of the first signal $S_{FF}$. In this way the linear transfer function applied by the processing module 303 is part of the feedback path and thus contributes to both the signal-transfer function (STF) for the whole circuit and the noise transfer function (NTF), i.e. the STF and NTF have the same components, whereas this would not be the case were the linear transfer function applied to the first signal $S_{FF}$.

By providing such a second processing module 303 which adapts the linear transfer function applied in this way, any error between the feedback signal $S_{FB}$ and the input signal $S_{IN}$ due to the linear effects of the forward signal path, including any applied gain, will be reduced or removed. Any residual error is thus due to non-linear effects in the signal path, e.g. distortion or the like. The first error signal $\varepsilon_1$ is determined from the first and second signals $S_{FF}$ and $S_{FB}$ after the linear transfer function has been applied and thus is indicative of this residual, non-linear error.

In the example of FIG. 3b the second processing module 303 applies the linear transfer function to the second signal $S_{FB}$. The first error signal $\varepsilon_1$ may thus be determined based on the output of the second processing module and the first signal $S_{FF}$.

The second processing module 303 thus applies the linear transfer function to the received second signal $S_{FB}$ and passes the processed second signal to a determination module 304 of the error block 302. The determination module 304 also receives the first signal $S_{FF}$ and determines the first error signal $\varepsilon_1$. The determination module 304 may simply be a digital combiner, e.g. a subtractor, arranged to subtract one digital signal from the other.

As mentioned above the linear transfer function applied by the second processing module 303 may, in effect, at least partly compensate for a linear transfer function H associated with the forward signal path, e.g. of the amplifier module 102. In use the transfer function H of the forward signal path may vary, for instance a gain associated with amplifier module 102 may be deliberately varied.

As the second processing module 303 applies a linear transfer function that is adaptive and responsive to the second error signal $\varepsilon_2$ the linear transfer function will automatically adapt to any gain changes introduced into the forward signal path, e.g. any variable amplification gain. Embodiments of the present disclosure thus advantageously provide a feedback arrangement that can be used with a variable gain amplifier module. However embodiments may be advantageously implemented even when the amplifier gain is not deliberately varied. A transfer function H associated with the forward signal path may also load dependent and thus may typically vary with different types of load. For an audio driving circuit operable with different types of load it can therefore be advantageous to adapt to the load connected. In addition environmental conditions such as temperature, PCB stress, ageing etc. can also have an impact on the transfer function H. Thus a transfer function associated with a forward signal path may change over time or with different operating conditions. Embodiments of the present disclosure adapt to such a changed linear transfer characteristic of the forward signal path.

The second processing module 303 adapts the linear transfer function applied based on the second error signal $\varepsilon_2$ indicative of the difference between the output from the second processing module 303 and the first signal $S_{FF}$. The second error signal $\varepsilon_2$ may be determined by a determination module 305, which may comprise a digital subtractor.

In some embodiments the second processing module 303 may comprise an adaptive filter, for example a finite impulse response (FIR) filter. The FIR filter may be adapted, for example according to a least-mean-squares (LMS) algorithm, for instance a recursive LMS algorithm to minimise the error in the second error signal $\varepsilon_2$ as would be understood by one skilled in the art. In some instances the adaptive filter could be an infinite-impulse-response filter (IIR).

The use of an adaptive processing module, such as an adaptive FIR filter adapted according to an LMS algorithm, can thus correct for errors between the first signal, indicative of the input signal, and the second signal, indicative of the audio driving signal.

Whilst a suitable adaptive processing module 303 can compensate for substantially any linear component of the transfer function of the forward signal path, in some embodiments there may be a gain element configured to apply a controlled gain to the first signal $S_{FF}$ or the second signal $S_{FB}$ to at least partly account for a known or expected gain the in the forward signal path. For example a digital gain element 306 could be arranged as part of the error block 302 to apply a controlled digital gain to the received second signal $S_{FB}$. The digital gain element 306 may, for instance, compensate for a known gain applied in the forward path. The digital gain element 306 may, in effect, at least partly compensate for a static or DC gain of the forward signal path, and the adaptive second processing module 303 compensates for any other difference and any variation over time. This may lead to faster settling on start-up and/or limit the range of signals supplied to the second processing module 303, which may be advantageous in relaxing the performance requirements of the second processing module 303.

As mentioned above the output from the second processing module 303 is thus a version of the second signal $S_{FB}$ which has been processed to at least partly compensate for linear effects in the forward signal path. As the first error signal $\varepsilon_1$ is determined, by determination module 304, using this processed signal and the first signal $S_{FF}$ the first error signal $\varepsilon_1$ thus is indicative of other errors, i.e. distortion or the like.

The first processing module 204 receives this first error signal and generates a compensation signal $S_C$ for applying to the input signal $S_{IN}$ of the forward signal path. In some embodiments the first processing module may apply some defined constant processing to the first error signal $\varepsilon_1$ to generate the compensation signal. As noted previously however the noise of ADC 207 can be an important consideration. The first processing module may therefore be configured to vary the extent to which the first error signal $\varepsilon_1$ contributes to a compensation signal applied to the input signal, for example based on the signal level, i.e. amplitude or envelope of the input signal $S_{IN}$. In some embodiments the first processing module 204 may therefore receive a version of the input signal $S_{IN}$.

Figure 4:
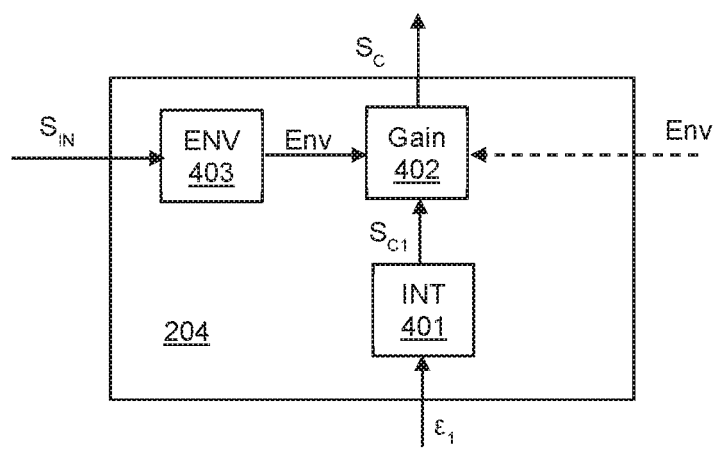
FIG. 4 illustrates an example of a processing module for generating a compensation signal.

FIG. 4 illustrates one example of a suitable first processing module 204. The first processing module comprises an integrator 401 which receives the first error signal $\varepsilon_1$. The output of the integrator 401 is thus a first compensation signal $S_C$, that is indicative of the overall error between the input signal $S_{IN}$ and the feedback signal $S_{FB}$. In some embodiments the integrated error signal $S_C$ could be applied directly as the compensation signal $S_C$, for instance by being subtracted from the input signal $S_{IN}$ by the combiner 203 (e.g. digital subtractor) in the forward signal path illustrated in FIG. 3. In the example of FIG. 4 however the first processing module 204 includes a gain controller 402 for applying a controlled gain to the first compensation signal to provide the compensation signal $S_C$ which is applied to the forward signal path. The gain controller 402 applies a controlled gain based on a parameter of the input signal, and in this example applies the controlled gain based on an indication of the signal level of the input signal $S_{IN}$ received at the input node 103.

As discussed previously the ADC 207 in the feedback path will introduce some noise into the signal path, e.g. quantisation noise. This ADC noise in the feedback signal $S_{FB}$ will result in at least some noise being introduced into the first error signal $\varepsilon_1$ and also into the first compensation signal $S_{C1}$. At least some ADC noise can thus be added to the forward signal path when the compensation signal is applied to input signal. This ADC noise is generally fixed and independent of signal level (although the noise may vary according to a bias applied to the ADC 207 which could be varied if desired to provide a trade-off between noise performance and power consumption). As also noted previously the ADC noise may be more significant for lower signal levels, where distortion is less of an issue. Thus the amount of any error between the input signal $S_{IN}$ and the output signal $S_{OUT}$ or audio driving signal $V_D$ may be expected to be relatively low. In such a case the ADC noise may be significant compared to the error that would exists without any compensation, unless a high performance ADC were used in the feedback path—with the associated size and/or power requirements. At higher signal levels the effects of distortion may be more of an issue, whereas the ADC noise will have less of an impact on SNR due to the higher signal level.

The gain controller 402 may therefore apply a controlled gain to the first compensation signal $S_{C1}$ based on an indication of the level of the input signal. At higher signal levels the controlled gain may apply a first gain. The first gain may effectively be unity so that the first compensation signal $S_{C1}$ is applied as the compensation signal $S_C$. At lower signal levels the gain is reduced from the first gain, i.e. to apply less amplification or a greater attenuation. For example the gain may be reduced to lower than unity to attenuate the first compensation signal $S_{C1}$. In some embodiments, for at least some signal levels, the controlled gain may be reduced to a minimum gain setting, which may be zero such that the first compensation signal $S_C$, is reduced to zero magnitude. This means that, in effect, the compensation signal applied $S_C$ has zero magnitude, i.e. there is no compensation signal applied. In such a case the feedback loop can be seen as being disabled and the audio circuit 301 operates in an open-loop mode.

In some embodiments the controlled gain applied by gain controller 402 may simply swap between the first gain or zero, e.g. the first processing module operates to either apply or block the first compensation signal $S_{C1}$. In which case, the gain controller 402 could be implemented as a switch or similar, or may be arranged to enable or disable an output of the integrator 401. However suddenly switching between the first compensation signal $S_{C1}$ being applied or not could potentially introduce unwanted transients. Therefore it may be advantageous to transition between the first gain and zero, or vice versa, via at least one intermediate gain setting, for instance by ramping the gain between the two gain settings in a stepwise or continuous fashion. In some embodiments however an intermediate gain between maximum and minimum gain settings may be used for some signal levels, e.g. to apply a compensation signal in which the ADC noise is attenuated (compared to the first gain setting) but which still provides some error correction to reduce distortion.

The gain controller 402 thus applies the controlled gain based on an indication of the level of the input signal $S_{IN}$, i.e. the signal envelope. In some embodiments therefore the first processing module may receive a version of the input signal $S_{IN}$ and determine an appropriate gain setting for the controlled gain. The first processing module 204 may thus comprise an envelope detector 403 for determining an envelope value Env for the input signal $S_{IN}$. There are various ways in which a digital envelope detector may determine an envelope value as would be understood by one skilled in the art. As used herein the term envelope detector will refer to any processing that determines an indication of the signal amplitude level. The envelope detector 403 may have a relatively fast attack time constant to respond quickly to any increases in signal level. The envelope value Env may be provided to the gain controller 402 to set the controlled gain appropriately. For instance the envelope value Env could be compared to one or more defined thresholds to determine an appropriate gain setting.

In some embodiments a suitable envelope detector could be off-chip, i.e. not part of the audio circuit 301. For instance in some implementations there may be an envelope detector arranged to determine an envelope value for the input signal $S_{IN}$ upstream of the input node 103. In which case the gain controller 402 may be configured to receive the envelope value Env from the upstream envelope detector.

Embodiments of the present disclosure thus provide an audio driver circuit that has a forward signal path with an amplifier module for outputting an analogue audio signal and a feedback path for receiving an analogue feedback signal derived from the output signal. An ADC is located in the feedback path to provide a digital feedback signal, which is used by an error block to determine an error between the input signal and the feedback signal. To account for any linear effects of the forward signal path the error block includes a processing module, which may be adaptive, for applying a linear transfer function to the digital feedback signal and/or a version of the input signal, such that the error signal corresponds to distortion of the output signal. The error signal can be used as the basis of a compensation signal to be applied to the input signal. In some embodiments, to avoid a problem of degrading SNR by introducing ADC noise into the forward signal path, the extent to which the error signal contributes to the compensation applied may be varied in use. Improved distortion performance can be achieved, without a significant impact on SNR and without requiring a very low noise ADC.

Note that as used herein the terms 'module' and 'block' shall both be used to refer to a functional unit for performing the stated function. A module or block may be implemented at least partly by dedicated hardware components such as custom defined circuitry and/or at least partly be implemented by one or more software processors or appropriate code running on a suitable general purpose processor or the like. The appropriate code may be stored in memory in the host device. It should also be noted that any components forming part of one module or block may be shared with another module or block and/or the same processor may implement multiple modules or blocks and may already be performing other control or data processing, which include other processing of the audio signal, e.g. pre-conditioning of the audio signal data stream.

It will be appreciated that the embodiments described above have been described with reference to a single-ended load with a return to ground. It will of course be appreciated that the output could be an H-bridge type arrangement. The principles of operation would be the same as described. The amplifier module 102 may comprise any type of amplifier, for instance of the Class AB type (possibly with Class G or H type power tracking) or a Class D type amplifier (in which case there may be off-chip filter components) whether with fixed or variable power rails. In particular the amplifier module may have variable gain.

Embodiments have been described with reference to an audio driving circuit for driving an audio transducer, which may be an audio transducer or an external device. It will be understood that the audio transducer may however be a transducer of a host device that comprises the audio driving circuit. The transducer may be a haptic transducer for example. The principles of the disclosure would also be applicable to amplification of other types of non-audio signal.

The skilled person will thus recognise that some aspects of the above described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments of the present invention will be implemented on a DSP (Digital Signal Processor), ASIC (Application Specific Integrated Circuit) or FPGA (Field Programmable Gate Array). Thus the code may comprise conventional program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communications with one another. Where appropriate, the embodiments may also be implemented using code running on a field-(re)programmable analogue array or similar device in order to configure analogue hardware.

Some embodiments of the present invention may be arranged as part of an audio processing circuit, for instance an audio circuit which may be provided in a host device. A circuit according to an embodiment of the present invention may be implemented as an integrated circuit. One or more speakers may be connected to the integrated circuit in use.

Embodiments of the present invention may be implemented in a host device, especially a portable and/or battery powered host device such as a mobile telephone, an audio player, a video player, a PDA, a mobile computing platform such as a laptop computer or tablet and/or a games device, for example.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

The invention claimed is:

1. An audio driving circuit comprising:
a forward signal path between an input for receiving an input audio signal and an output for outputting an output signal;
an amplifier module in the forward signal path;
an error block for receiving a first signal derived from the input signal and a second signal derived from the output signal and operable to determine a first error signal indicative of a difference between the first and second signals;
a first processing module operable to generate a compensation signal to be applied to the input signal upstream of the amplifier module, wherein the compensation signal is based on the first error signal;
wherein the error block comprises a second processing module configured to apply a linear transfer function to one of the first signal or the second signals prior to determining the first error signal;
wherein the linear transfer function is adaptive based on a second error signal, wherein the second error signal is indicative of a difference between the first and second signals after the linear transfer function has been applied.

2. An audio driving circuit as claimed in claim 1 wherein the second processing module is configured to apply a least-mean-squares adaptation or a recursive least-mean-squares adaptation to the second transfer function based on the second error signal.

3. An audio driving circuit as claimed in claim 1 wherein the amplifier module is operable to provide a variable gain in the forward signal path.

4. An audio driving circuit as claimed in claim 1 where the first processing module is configured to control the extent to which the first error signal contributes to the compensation signal applied to the input audio signal based on an indication of the level of the input audio signal.

5. An audio driving circuit as claimed in claim 4 wherein the first processing module comprises a gain controller for applying a controlled gain to a first compensation signal derived from the first error signal to generate the compensation signal applied to the input audio signal, wherein the controlled gain is controlled based on the indication of the level of the input audio signal.

6. An audio driving circuit as claimed in claim 5 wherein the gain controller is operable such that the controlled gain is a first gain for a first input audio signal level and is a second lower gain for a second lower input audio signal level.

7. An audio driving circuit as claimed in claim 6 wherein the first processing module comprises an integrator configured to receive the first error signal and output the first compensation signal.

8. An audio driving circuit as claimed in claim 5 comprising an envelope detector configured to receive a version of the input audio signal and determine an envelope value as said indication of the level of the input audio signal.

9. An audio driving circuit as claimed in claim 1 wherein the audio circuit is operable in an open-loop mode wherein the compensation signal has zero magnitude or is not applied to the input signal in the forward signal path.

10. An audio driving circuit as claimed in claim 1 further comprising a gain element configured to apply a gain to one of the first or second signals to compensate for a known gain in the forward signal path.

11. An audio driving circuit as claimed in claim 1 further comprising an analogue-to-digital conversion module for receiving an analogue feedback signal derived from the audio driving signal and outputting a corresponding digital signal as said second signal.

12. An audio driving circuit as claimed in claim 11 wherein the audio driving circuit is implemented as an integrated circuit.

13. An audio driving circuit as claimed in claim 12 wherein the analogue-to-digital conversion module is configured to receive the analogue feedback signal externally from the integrated circuit.

14. An audio apparatus comprising an audio driving circuit as claimed in claim 1.

15. An audio apparatus as claimed in claim 14 wherein the output of the audio driving circuit is coupled to an output audio path that comprises at least one non-linear component wherein said second signal indicative of the voltage of the output signal is derived from the output audio path downstream of the at least one non-linear component.

16. An audio apparatus as claimed in claim 14 further comprising a first connector for removably connecting to a mating second connector of a peripheral device wherein the apparatus is operable, in use, to supply the output signal to the first connector for driving an audio transducer of a connected peripheral device.

17. An audio apparatus as claimed in claim 15 wherein the audio apparatus comprises at least one of: a battery powered device; a portable device; a communications device; a mobile telephone; a smartphone; a computing device; a laptop; notebook or tablet computer; a gaming device; a personal media player; a wearable device; a voice controlled device.

18. An audio driving circuit for receiving an input audio signal and an output for outputting an output signal, the audio driving circuit comprising:
- an amplifier;
- an error block for determining a first error signal indicative of any error between the input audio signal and a feedback signal derived from the output signal; and
- a compensation module for combining the input audio signal with a compensation signal based on the first error signal;
- wherein the error block comprises a processing module for applying a linear transfer function to the input audio signal or the feedback signal before determining the first error signal;
- wherein the linear transfer function is adaptive based on a second error signal, wherein the second error signal is indicative of a difference between the first and second signals after the linear transfer function has been applied.

* * * * *